United States Patent [19]

Kreft et al.

[11] Patent Number: 4,698,996
[45] Date of Patent: Oct. 13, 1987

[54] METHOD FOR CALIBRATING AN ELECTRONIC POSITION TRANSMITTER

[75] Inventors: Hans-Diedrich Kreft, Aumühle; Michael Jenning, Hamburg; Holger Mackenthun, Hamburg; Thorten Baik, Hamburg; Thomas Niznik, Hamburg, all of Fed. Rep. of Germany

[73] Assignee: Angewandte Digital Elektronik GmbH, Fed. Rep. of Germany

[21] Appl. No.: 801,879

[22] Filed: Nov. 26, 1985

[30] Foreign Application Priority Data

Nov. 27, 1984 [DE] Fed. Rep. of Germany ....... 3443176

[51] Int. Cl.⁴ .................. G01B 7/02; G01D 18/00
[52] U.S. Cl. ........................ 73/1 J; 324/202
[58] Field of Search ............... 73/1 J; 364/571; 324/202

[56] References Cited

U.S. PATENT DOCUMENTS

| 4,263,803 | 4/1981 | Burkhardt | 73/1 J X |
| 4,365,196 | 12/1982 | Finch | 324/202 X |
| 4,462,083 | 7/1984 | Schwefel | 364/571 X |
| 4,473,797 | 9/1984 | Shiota | 364/571 X |
| 4,652,821 | 3/1987 | Kreft | 324/208 |

FOREIGN PATENT DOCUMENTS 3244891 12/1986 Fed. Rep. of Germany .
6102 1/1981 Japan .................................. 73/1 J Primary Examiner—Tom Noland
Attorney, Agent, or Firm—Hill, Van Santen, Steadman & Simpson

[57] ABSTRACT

A method for calibrating a device for non-contact position measurement wherein a movable part subject to positional identification is provided spatially proximate to a sensor carrier that includes a plurality of signal generators electrically and spatially separated from one another in order that the position of the moving part can be identified via voltage signals therefrom. To obtain an unequivocal characteristic of the positional voltage distribution, only defined signals such as a zero value signal or other characteristic value, have length values signed to them and neighboring voltage values are co-employed to obtain an unequivocal position identification.

9 Claims, 6 Drawing Figures

METHOD FOR CALIBRATING AN ELECTRONIC POSITION TRANSMITTER

BACKGROUND OF THE INVENTION

1. Field of the Invention

The invention relates generally to a method for calibrating and using a non-contact position measuring instrument having a plurality of sensors disposed spatially proximate to a movable position indicator and, more particularly, to assigning of a length value to a signal generator when its output is a predetermined value and storing of the length values for later comparison in determining unknown positions of the position indicator.

2. Description of the Prior Art

A non-contact position indicator is disclosed in German Pat. OS No. 32 44 891 in which a magnet is mounted for movement parallel to a plurality of magnetic sensors. For each position of the magnet, the sensors are individually interrogated over the entire range of influence of the magnet to produce a positional voltage distribution. For each positional dislocation of the magnet, a new positional voltage distribution is produced which is uniquely identifiable with the magnet position.

In a calibration pass, the characteristic positional voltage distributions are assigned to individual magnet positions and stored in memory. In later measuring passes, an unknown position of the magnet is thereafter found by allocation of a measured positional voltage distribution to the stored positional voltage distributions. Thus, by attaching a magnet to a movable part, a position indicator can be provided.

Such a position indicator requires that, for extremely long position indicator paths, a large number of voltage values must be stored. Also, changes in the spacing between the position indicator and the sensors in the signal generator can change the positional voltage distribution under certain conditions, and variations in the magnet can also lead to changes in the voltage distribution resulting in inaccurate position indications, or possibly even unidentifiable magnet positions.

SUMMARY OF THE INVENTION

In accordance with the present invention means are provided for calibrating a non-contact position indicator which provides positive and unequivocal identification of the positional voltage distribution. This and other features of the present invention are embodied in a calibrating method wherein the position indicator is moved parallel to a line of signal generators, or sensors and each signal generator has a length value assigned to it when its output signal is of a characteristic value, such as zero, and the neighboring signal generators on either side are respectively positive and negative. Further length values are assigned when the voltage values of neighboring signal generators exhibit precisely defined conditions.

A position identifier is utilized having a magnetic position indicator movable parallel to a plurality of spaced sensors, each of the sensors producing an output signal which is generally linear with respect to motion of the magnet when the magnet is adjacent thereto. Given a uniform magnetic field distribution of the magnetic position indicator, when the magnet resides directly adjacent a sensor, a characteristic signal value is emitted thereby. By presetting each sensor output, the characteristic signal preferably has a voltage of zero volts. As the magnet moves and one of its poles approaches a sensor, a linear rise or, respectively, drop, of its output signal voltage occurs. Depending upon the strength of the magnetic field generated by the magnet and the distance of the magnet from the sensor, the linear curve becomes nonlinear until a maximum output voltage is reached as a result of the influence of the magnetic field, after which the output voltage falls off.

The present method utilizes four characteristics of a magnetic field sensor. The first characteristic being that a zero volt output signal of the sensor defines a very exact position of the magnet. A second characteristic is that the signal generator output is linear for longitudinal dislocations of the magnet within specific limits. A third is that parallel changes in the distance between the magnet and the sensor result only in changes of the slope of the output signal in the linear region of the sensor. And a fourth, for adequately long magnets relative to the spacing of the sensors, output voltage values of neighboring sensors are within the linear region of the output signal characteristic.

The method of the present invention is as follows: a magnet is moved parallel to a line of magnetic field sensors by a suitable mechanical apparatus in defined, prescribed distance steps. The length value which corresponds to a zero volt, or some other predetermined voltage value, output signal of each sensor is assigned to each respective sensor. Furthermore, output voltage values from neighboring sensors are compared and length units are allocated thereto when specific voltage conditions are achieved. Thus, length units are assigned to magnet positions by way of relationships of sensor output voltage values.

For unknown positions of the magnetic position indicator, the voltage values of neighboring sensors influenced by the magnet are measured and the relationships of neighboring sensor signals are determined. The voltage values of the sensors characterized by a change of sign are selected. For voltage relationships which correspond exactly to a calibrated voltage relationship, the corresponding calibrated positional value is assigned to the unknown position. For voltage relationships lying between the calibration values, suitable interpolation methods can be used to define magnet position.

In another embodiment of the present method, specific voltage relationships are stored during a calibration pass for constant step-wise positional dislocations of the magnetic indicator, as opposed to the first embodiment wherein the actual length units are stored. One advantage of this second embodiment is that precise numerical relationships of the voltage values are identifiable for specific step distances of the calibrated system. Thus, the first embodiment defines the position of the indicator in terms of sensor spacing, while the second embodiment defines the position of the indicator in terms of the step spacing during a calibration pass.

To practice the present invention, a bar magnet is rigidly connected to a length system and moved step-by-step parallel to a line of sensors in precisely defined length units. When an output voltage of a particular signal generator is at zero while neighboring signal generators on either side thereof have respective positive and negative output signals, then a length value is assigned to the particular sensor and stored. This is repeated for each of the sensors over which the movable magnet is centrally positionable. During movement of the magnet, precisely defined voltage value relationships of neighboring sensors can be identified. For these identified voltage relationships the value assigned to the magnet position is likewise stored. Positions of the magnet are defined between sensors where an imaginary sensor would have the output value of zero. Thus, an unknown position of a magnet can be discovered by interpolation of neighboring signals.

DESCRIPTION OF THE PREFERRED EMBODIMENTS

Figure 1:
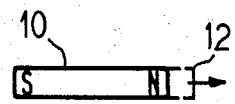
FIG. 1 shows a schematic representation of a bar magnet and a plurality of sensors and a graph of the resulting sensor output voltage distribution for the magnet position.
Figure 1:
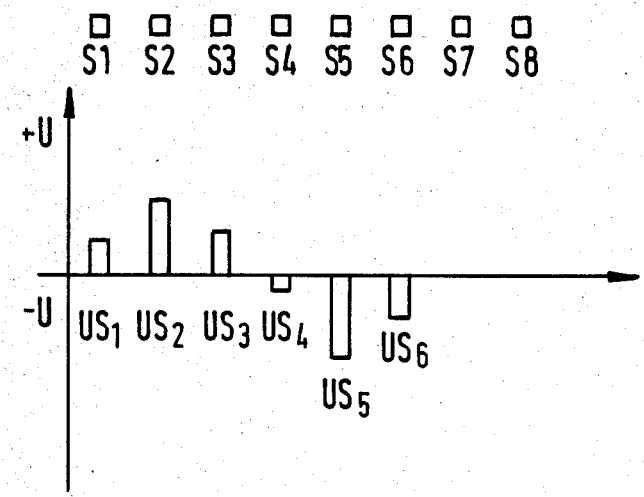

In FIG. 1, a magnet 10 is shown adjacent a plurality of magnetic sensors or signal generators S1–S8 arranged spatially and inductively separate from one another. The magnet 10 is shown schematically as a bar magnet with the north and south poles indicated N and S, respectively, although any type of magnetic device may be used. The magnetic sensors S1–S8 are likewise shown schematically and have a positional relationship relative to the magnet 10. In the graph of FIG. 1, a voltage distribution of the sensor output signals US–US$_6$ is shown for the magnet position illustrated in solid lines in FIG. 1. The output voltages that are produced by the south pole S of the magnet 10 have a positive voltage value and those that are produced by the north pole N have a negative voltage value, although the opposite could also be true.

In a preferred embodiment, an electronic multiplexer (not shown) connects individual ones of the sensors to an interrogation and evaluation means (not shown) which identifies the position of the magnetic position indicator by assigning a characteristic signal value to the position.

Figure 2:
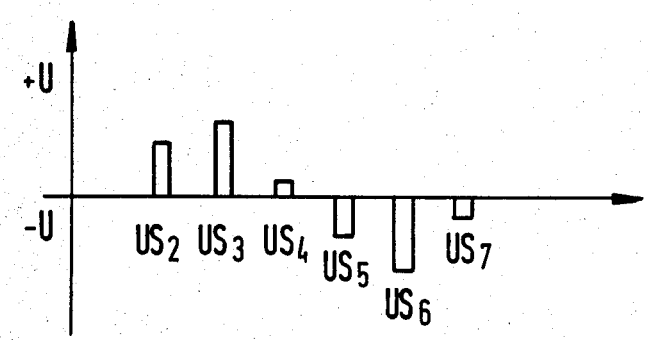
FIG. 2 shows the sensors of FIG. 1 with the magnet dislocated relative thereto and a graph of voltage distribution for the magnet dislocation.

In FIG. 2, a positional voltage distribution is shown for a magnet position 12 illustrated in broken lines in FIG. 1 which is displaced from the position shown in solid lines in FIG. 1. The voltage outputs of the individual sensors S2–S7 shown as respective voltages US$_2$–US$_7$. The change in sensor outputs of the sensors S1–S8 for the magnet positions 10 and 12 can be seen by comparing FIGS. 1 and 2.

Figure 3:
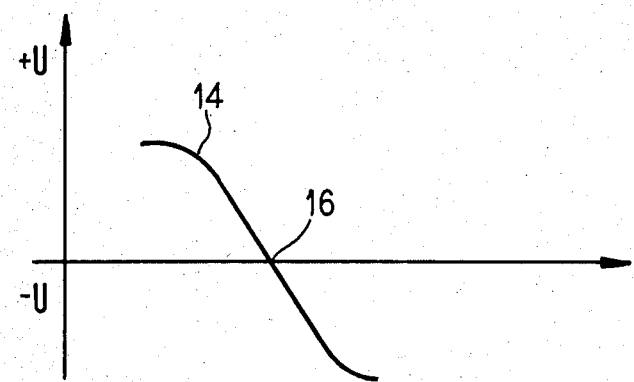
FIG. 3 is a graph of a single sensor output as a magnet is moved relative thereto.

FIG. 3 shows the voltage output characteristic 14 of a single sensor or signal generator S4 as a magnet 10 is moved endwardly therepast. When the north pole N approaches the signal generator S4, the voltage value 14 becomes more negative, falling below a zero position 16. When the south pole S approaches the signal generator S4, the voltage value becomes more positive and rises above the zero value 16. The signal output 14 of the signal generator S4 is substantially linear in the proximity of the zero position 16. The same is true for the output of other signal generators in the position indicator as well.

Figure 4:
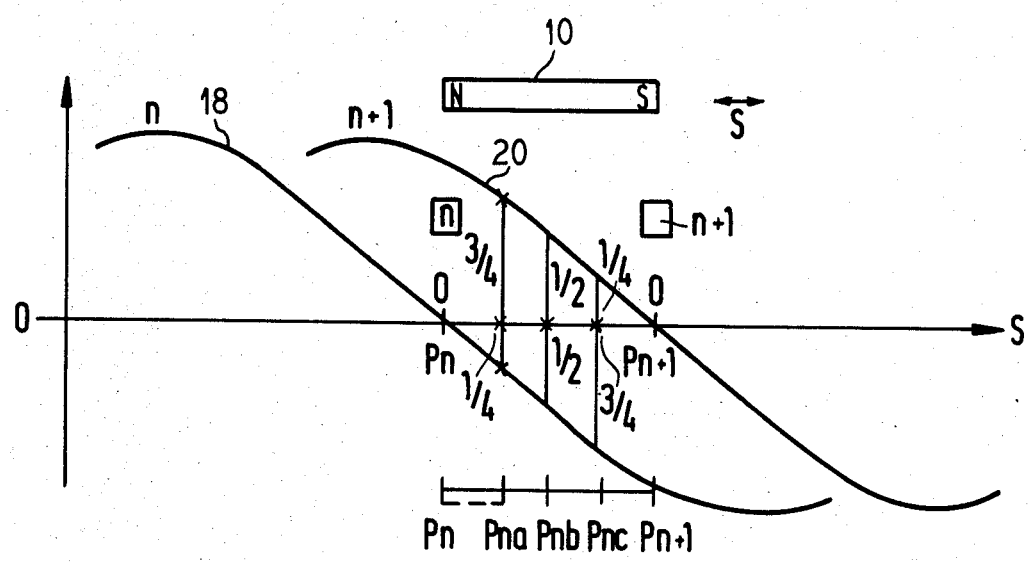
FIG. 4 is a graph of a pair of sensor outputs for various magnet positions.

FIG. 4 shows the voltage output characteristics 18 and 20 for two neighboring signal generators n and n+1, respectively. When the output value of the signal generator n is zero, the magnet position is identified as positional value P$_n$ and, respectively, when the voltage output value of the signal generator n+1 is zero the magnet position is identified as P$_{n+1}$. When the magnet 10 is shifted between the two signal generators n and n+1, specific voltage relationships occur between the output signals 18 and 20 as shown, for example, by the corresponding fractions in FIG. 4. When certain numerical relationships between the output voltage values are reached during calibration, the corresponding positional values P$_{na}$–P$_{nc}$ are assigned to the magnet positions. For instance, when the output of signal generator n is equal to, but of opposite sign with, the output of the signal generator n+1, the magnet position is half way between P$_n$ and P$_{n+1}$ and is identified as P$_{n6}$. Likewise, when the absolute value of the signals 18 and 20 have a ratio 1:3, the magnet position is identified as P$_{na}$, which is midway between P$_n$ and P$_{n6}$. Thus, when the signal generators n and n+1 yield these known signal relationships during later measurements, the positions P$_n$–P$_{n+1}$, as shown in FIG. 4, can be identified therefrom.

Figure 5:
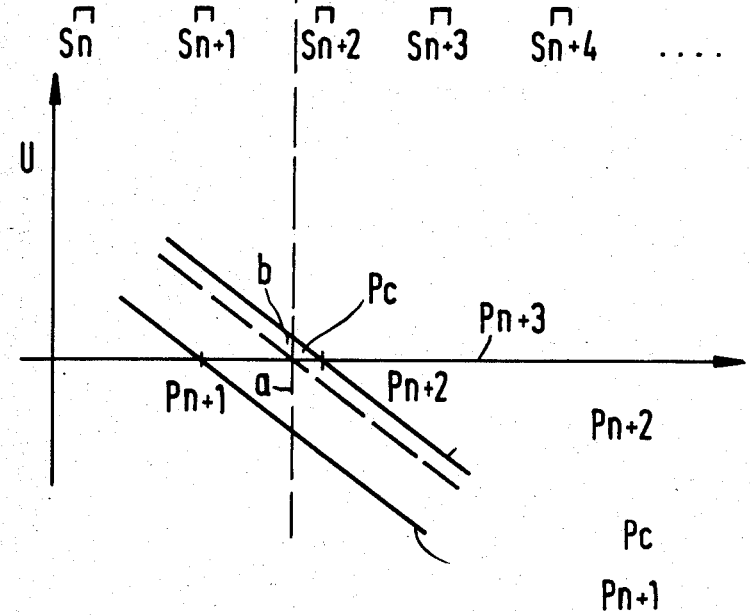
FIG. 5 shows a magnet and sensor arrangement positioned relative thereto and a graph for determining the position of the magnet.

In FIG. 5, a calibration position P$_c$ of the magnet 10 is derived from an output voltage relationship a:b for the sensors S$_{n+1}$ and S$_{n+2}$, respectively. A virtual voltage characteristic of an imaginary signal generator can be drawn through the point P$_c$ such that the imaginary signal generator would supply a voltage value of zero precisely at this position. The magnet position P$_c$ is thereafter identifiable by the voltage relationship a:b.

Figure 6:
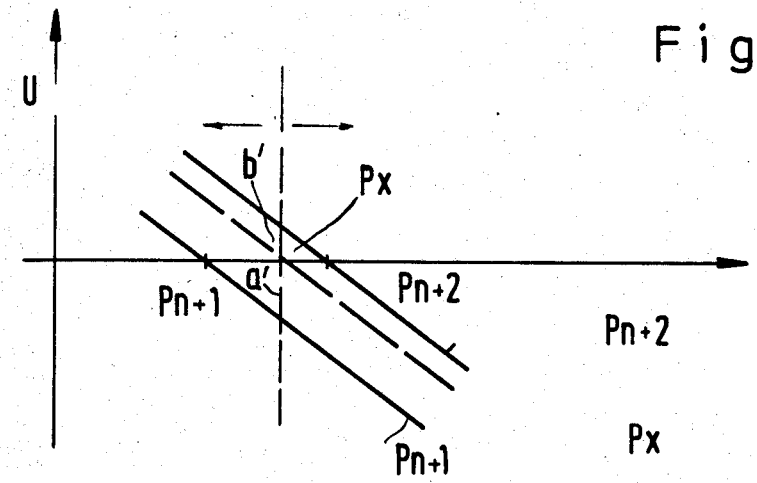
FIG. 6 is a graph for determining an unknown position of a magnet given calibrated magnet positions.

In FIG. 6, an unknown magnet position P$_x$ produces a voltage relationships a':b' which does not correspond to any known calibration point. Such a position P$_x$ is enclosed, however, by known calibration positions P$_{n+2}$ to the right side and P$_{n+1}$ to the left side. The magnet position P$_x$ is identified by interpolation methods from the voltage relationship a':b'. Thus, once known magnet positions are identified, virtually any unknown magnet position can also be identified by comparison of the substantially linear signals from neighboring sensors.

It is apparent from the foregoing specification that the invention is susceptible to being embodied with various alterations and modifications which may differ particularly from those that I have described in the preceding specification and description. It should be understood that I wish to embody within the scope of the patent granted hereon all such modifications as reasonably and properly come within the scope of my contribution to the art.

We claim as our invention:

1. A method for calibrating a non-contacting electronic position measuring device having a sensor array of a plurality of spaced sensors and a movable position indicator for movement therealong such that output signals of said sensors are influenced by said movable position indicator, the method comprising:

moving said position indicator along said sensor array in a calibration pass;

defining positions of said position indicator in terms of relative output signals of said sensors, said defined positions being characterized by a change in sign of neighboring ones of said sensors; and storing the relative output signals of said sensors for each of said defined positions;

whereby said position measuring device may subsequently be used to determine unknown positions of said position indicator.

2. A method as claimed in claim 1, further comprising:
assigning a length value to each of said sensors when the output signal of said each sensor is a characteristic value and when neighboring ones of said sensors on either side of said each sensor generate respective positive and negative output signals.

3. A method as claimed in claim 2, wherein said characteristic value is zero so that said defined positions of said indicator are determined in terms of the spacing of said sensors.

4. A method as claimed in claim 2, further comprising the steps of:
storing further length values during the calibration pass of said position indicator when voltage values of neighboring ones of said sensors exhibit precisely defined relationships.

5. A method as claimed in claim 1, wherein said movement of said position indicator occurs in predetermined step lengths so that said defined positions of said indicator are determined in terms of said predetermined step lengths.

6. A method as claimed in claim 5, wherein said predetermined step lengths are of constant length.

7. A method as claimed in claim 1, wherein said position indicator is a magnet and said sensors are magnetic field sensors.

8. A method for calibrating a non-contacting electronic position measuring device having a sensor array of a plurality of spaced sensors and a movable position indicator for movement therealong such that output signals of said sensors are influenced by said movable position indicator, the method comprising:
moving said position indicator parallel to said sensor array in a calibration pass;
assigning a length value to each of said sensors when an output signal of said each sensor is a characteristic value and when neighboring ones of said sensors on either side of said each sensor simultaneously generate respective positive and negative output signals; and
storing said length values for various positional dislocations of said position indicator;

whereby said length values are subsequently usable to determine unknown positions of said positions indicator.

9. A method for calibrating a non-contacting electronic position measuring device having a sensor array of a plurality of spaced sensors and a movable position indicator for movement therealong such that output signals of said sensors are influenced by said movable position indicatior, the method comprising:
moving said position indicator along said sensor array in constant width steps in a calibration pass;
defining positions of said position indicator in terms of relative output signal voltage relationships for neighboring ones of said sensors for each of said constant width steps; and
storing said relative output signal voltage relationships for each of said constant width positional steps;

whereby said calibrated positioned measuring device may subsequently be used to determine unknown positions of said position indicator.

* * * * *